United States Patent
Crumly

(10) Patent No.: US 6,303,988 B1
(45) Date of Patent: Oct. 16, 2001

(54) WAFER SCALE BURN-IN SOCKET

(75) Inventor: William R. Crumly, Anaheim, CA (US)

(73) Assignee: Packard Hughes Interconnect Company, Irvine, CA (US)

( * ) Notice: Subject to any disclaimer, the term of this patent is extended or adjusted under 35 U.S.C. 154(b) by 0 days.

(21) Appl. No.: 09/064,338

(22) Filed: Apr. 22, 1998

(51) Int. Cl.[7] ............... H01L 23/48; H01L 23/52
(52) U.S. Cl. ............... 257/690; 257/693; 257/783; 257/784
(58) Field of Search ............... 257/48, 643, 629, 257/632, 690, 784, 780, 781, 693, 698, 783; 438/780, 626, 665, 125

(56) References Cited

U.S. PATENT DOCUMENTS

| | | | |
|---|---|---|---|
| 4,403,272 | * 9/1983 | Larson et al. | 361/398 |
| 5,213,511 | 5/1993 | Sobhani | 439/67 |
| 5,245,135 | * 9/1993 | Schreiber et al. | 174/261 |
| 5,327,013 | * 7/1994 | Moore et al. | 257/772 |
| 5,412,539 | 5/1995 | Elwell et al. | 361/792 |
| 5,455,518 | 10/1995 | Sobhani | 324/765 |
| 5,475,236 | * 12/1995 | Yoshizaki | 257/48 |
| 5,478,781 | * 12/1995 | Bertin et al. | 438/109 |
| 5,517,127 | 5/1996 | Bergeron et al. | 324/760 |
| 5,523,586 | 6/1996 | Sakurai | 257/48 |
| 5,525,545 | 6/1996 | Grube et al. | 437/209 |
| 5,530,375 | 6/1996 | Seidel | 324/761 |
| 5,530,376 | 6/1996 | Lim et al. | 324/765 |
| 5,532,174 | 7/1996 | Corringan | 437/8 |
| 5,532,612 | 7/1996 | Liang | 324/760 |
| 5,532,614 | 7/1996 | Chiu | 324/763 |
| 5,534,785 | 7/1996 | Yoshizaki et al. | 324/758 |
| 5,534,786 | 7/1996 | Kaneko et al. | 324/760 |
| 5,616,960 | * 4/1997 | Noda et al. | 257/760 |
| 5,790,377 | * 8/1998 | Schreiber et al. | 257/737 |
| 5,834,845 | * 11/1998 | Stolmeijer | 257/752 |
| 5,896,271 | * 4/1999 | Jensen et al. | 257/692 |
| 5,946,555 | * 8/1999 | Crumly et al. | 438/125 |

* cited by examiner

Primary Examiner—Phat X. Cao
(74) Attorney, Agent, or Firm—Thomas N. Twomey

(57) ABSTRACT

Generally, the invention includes a product for and a method of wafer scale burn-in testing. The product may include a substrate or semiconductor device having a nonplanar surface (multi-layer substrate), an interposer layer over the nonplanar surface and electrical traces on the interposer having raised electrical features for connecting to contact pads on a semiconductor wafer. The interposer layer may take on a variety of configurations and compositions. The interposer layer may be an adhesive layer, or a combination of a flexible layer for supporting the electrical traces and raised features, and a compressible layer. Vias may be provided from the electrical traces down to contact pads on the substrate or device having a nonplanar surface. Alternatively, electrical traces having a first and second raised features extending in opposite directions may be utilized to make a connection between the wafer and the multi-layer substrate.

7 Claims, 4 Drawing Sheets

WAFER SCALE BURN-IN SOCKET

TECHNICAL FIELD

This invention relates to products for and methods of testing semiconductor devices.

BACKGROUND OF THE INVENTION

Semiconductor devices such integrated circuit chips are often packaged on a substrate, wire bonds attached to contact pads on the integrated circuit chip and a plastic housing secured to the substrate and/or chip. Packaging often takes the lead frame input and output routings from about 6–7 mil pitch and opens them up to a 20 mil pitch or more. The package makes chip testing easy because the easiest way to make contact with the chip is through wire bonding. If the chip fails the testing, the entire package must be thrown away. The situation becomes more problematic with respect to multi-chip modules containing a set of chips. After packaging, if one chip is bad, the entire chip set and package must be thrown away.

Therefore, it is desirable to do burn-in testing on bare-die chips before they are packaged. To date there are a variety of ways to make a temporary connection to a bare-die chip. However, most of these approaches test a single chip at a time.

Attempts to test integrated circuits at the wafer level becomes even more complicated. At the wafer level (i.e., before the individual chips are cut from the wafer), there may be 500 dies to test. This requires 500 times the power and 500 times the amount of electrical routing. In order to test all of the dies at the same time it becomes necessary to utilize a multi-layer substrate having a plurality of circuits built on top of each other to achieve the dense electrical routing requirements necessary for testing at the wafer level. However, since a plurality of circuits are built on top of each other, such multi-layer substrates having a nonplanar top surface. The top surface of the multi-layer substrate may also become further warped during the fabrication process of the substrate. A direct connection between the flat surface of the wafer and the nonplanar top surface of the multi-layer substrate cannot be made due to the uneven topography of the multi-layer substrate.

The present invention provides advantages and alternatives over the prior art.

SUMMARY OF THE INVENTION

Generally, the invention includes a product for and a method of wafer scale burn-in testing. The product may include a substrate or semiconductor device having a nonplanar surface (multi-layer substrate), an interposer layer over the nonplanar surface and electrical traces on the interposer having raised electrical features for connecting to contact pads on a semiconductor wafer. The interposer layer may take on a variety of configurations and compositions. The interposer layer may be an adhesive layer, or a combination of a flexible layer for supporting the electrical traces and raised features, and a compressible layer. Vias may be provided from the electrical traces down to contact pads on the substrate or device having a nonplanar surface. Alternatively, electrical traces having first and second raised features extending in opposite directions may be utilized to make a connection between the wafer and the multi-layer substrate.

These and other objects, features and advantages of the present invention will become apparent from the following brief description of the drawings, detailed description and appended claims and drawings.

DESCRIPTION OF THE PREFERRED EMBODIMENT

Figure 1:
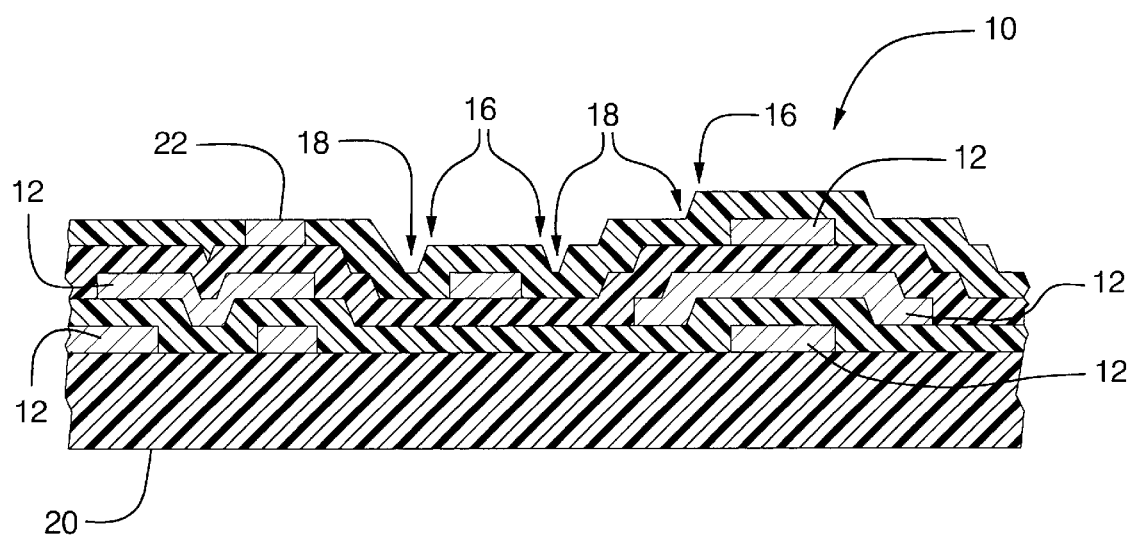
FIG. 1 illustrates one embodiment of the present invention.

FIG. 1 illustrates one embodiment of the present invention and includes a semiconductor device or multi-layer substrate 10 having a plurality of electrical traces 12 forming circuits that are separated by a dielectric layer 14 and built on top of each other. The multi-layer substrate or semiconductor device has a top surface which is nonplanar and includes bumps 16 and valleys 18. For example, the multi-layer substrate may include a base layer 20 which may be flexible or rigid. Conductive lines 12 are deposited on the base layer to define an electrical circuit, and an insulation layer 14 deposited over the conductive lines. Successive conductive circuit lines and insulation layer combinations are built up on top of each other resulting in a top surface of the multi-layer device which has an uneven or nonplanar topography.

The top surface of the multi-layer substrate has a topography which is nonplanar to a degree which makes it impossible or impractical to make a direct connection between contact pads 22 on the top surface of the multi-layer substrate 10 and a flat semiconductor wafer (not shown) without damaging or breaking the wafer or adding substantial cost.

Figure 2:
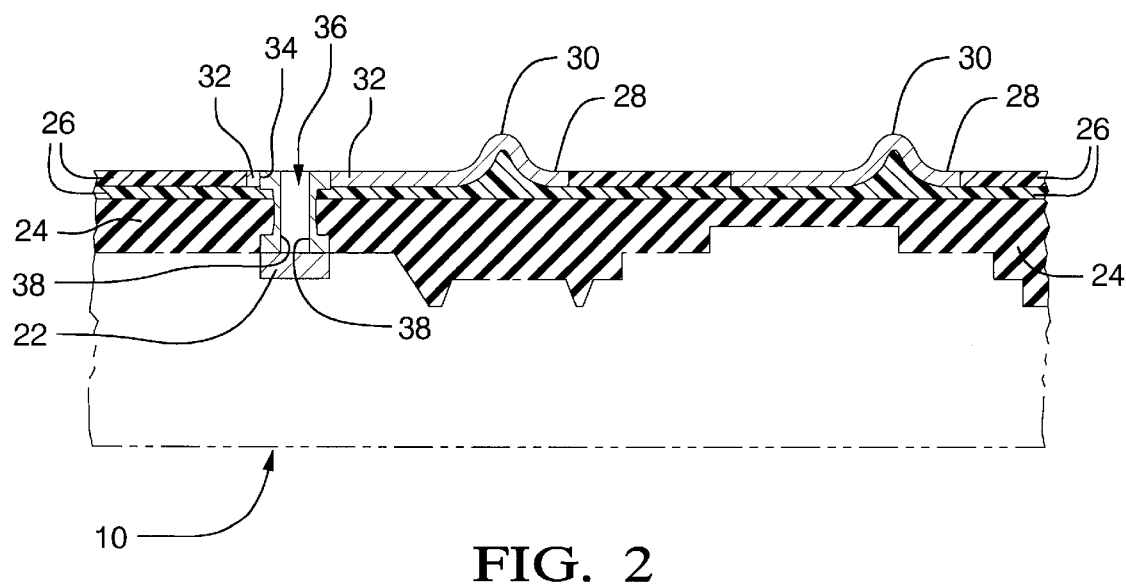
FIG. 2 illustrates a second embodiment of the present invention.

Referring to FIG. 2, a product according to the present invention may include a compressible layer 24 secured to the top of the nonplanar surface of the multi-layer substrate 10 (shown in phantom lines) preferably by a very thin adhesive layer (not shown). The compressible layer 24 may be an elastomer, foam, rubber, or other suitable material capable of being compressed with application of minimal force such as, in one embodiment, a few grams. Some adhesive materials may be used as the compressible layer 21. A flexible circuit which may be placed on top of the compressible layer 24 includes a flexible substrate 26 such as a polyimide material and preferably is secured to the compressible layer by a very thin adhesive layer (not shown). Electrical traces 28 are carried by the flexible substrate 26 and include raised contact features that will be used to make electrical connection to a contact pad on the semiconductor wafer (not shown). Spaced a distance from the raised feature is a contact pad 32. In one embodiment, a hole 34 is provided in the contact pad at the time the electrical traces are made or may be produced later by etching techniques. A via 36 is provided through the flexible and compressible layers 26, 24 by any of a variety of methods such as using a laser to scribe down to the contact pad 22 on the multi-layer substrate 10. An electrically conductive material 38 is provided from the electrical traces 28 on the flexible substrate to the contact pad 22 on the multi-layer substrate by any of a variety of methods such as electroless plating copper into the via or by depositing conductive paint or ink into the via by methods known to those skilled in the art.

Figure 3A:
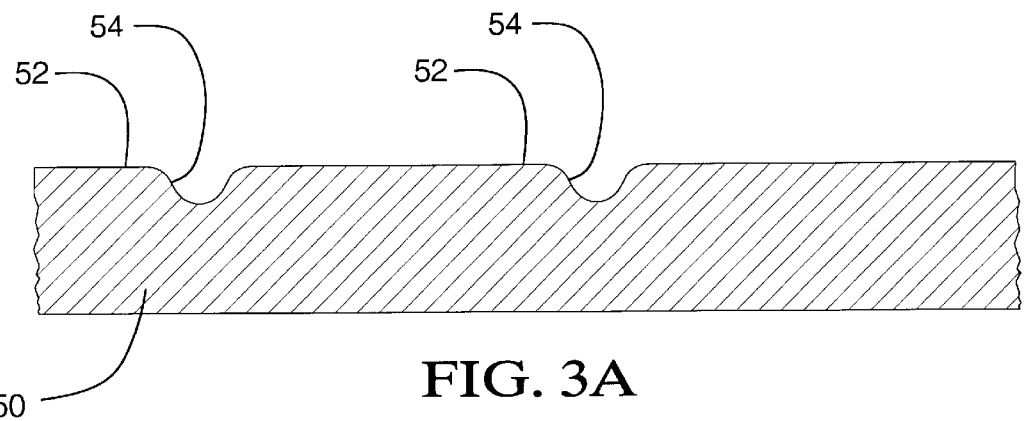
FIGS. 3A–3F illustrate steps in a method of making an embodiment of the present invention.
Figure 3B:
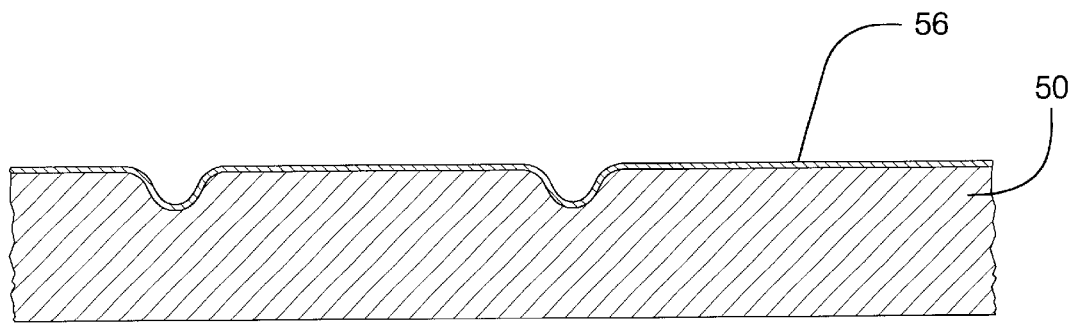

FIGS. 3A–3F illustrate a method of making the embodiment of FIG. 2. As shown in FIG. 3A, the method utilizes a mandrel 50 having a substantially flat surface 52 and dimples 54 formed therein. The mandrel is then coated with a very thin copper 56 coating, typically referred to as flash-plating, which covers the entire surface of the mandrel including the dimples 54 or depressions, as shown in FIG. 3B. The flash-plated copper 56 is applied by electroplating or other known techniques and provides a thin conductive coating that prevents adhesive from adhering to the mandrel surface. The flash-plating is a conventional electrolytic plating formed in a very short or momentary operation so that only a very thin plating coat is provided. The flash-plated coat is very thin compared to the thickness of the electrical circuit traces that are made. For example, for a circuit trace of 1½ mil thickness, a flash-plating of copper on the mandrel will have a thickness of about 0.01 to 0.2 mils. The thin flash-plating is employed because it can be relatively easily released from the stainless steel mandrel, and in addition, may be readily removed from the lamination after separation from the mandrel by flash-etching, which is a very short time or momentary etching process. Obviously, other methods for coating the mandrel with a very thin coating of conductive material that is easily separated from the mandrel and which can be readily removed from the completed circuit traces may be employed in place of electrolytic flash-plating. Such methods may include sputtering, vapor deposition and electroless plating. The flash-plated copper is coated with a photoresist 58, which is then optically exposed through a mask defining a pattern of desired circuit and developed. The photoresist that is not polymerized is then removed to leave the partially completed assembly. As shown, the flash-plated copper now bears a pattern of photoresist that is a negative pattern of the circuit trace pattern to be fabricated with this mandrel.

Figure 3C:
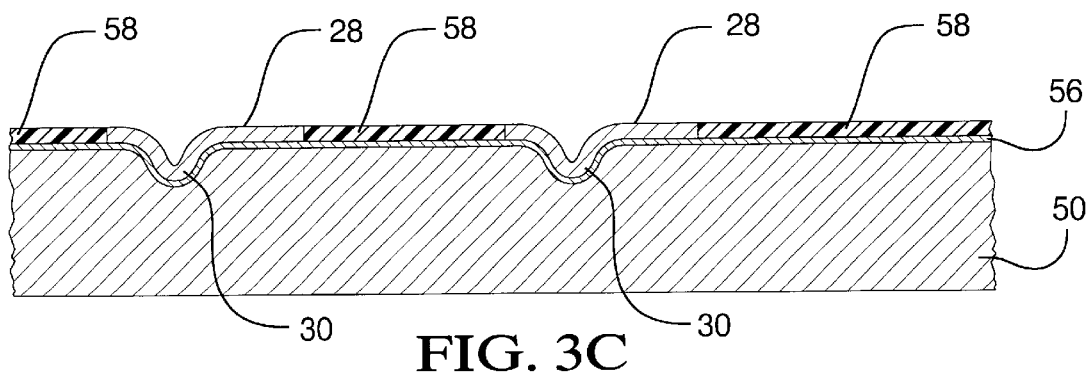

As shown in FIG. 3C, the mandrel assembly is then subjected a suitable additive electroforming process, such as, for example, electroplating to plate up copper traces 28 over the mandrel surface and into the depressions or dimples. The copper traces 28 are plated directly onto those portions of a flash-plated copper coating that are not covered by the negative pattern of the developed photoresist. Thus the plating process simultaneously forms both the circuit traces and the raised feature.

Figure 3D:
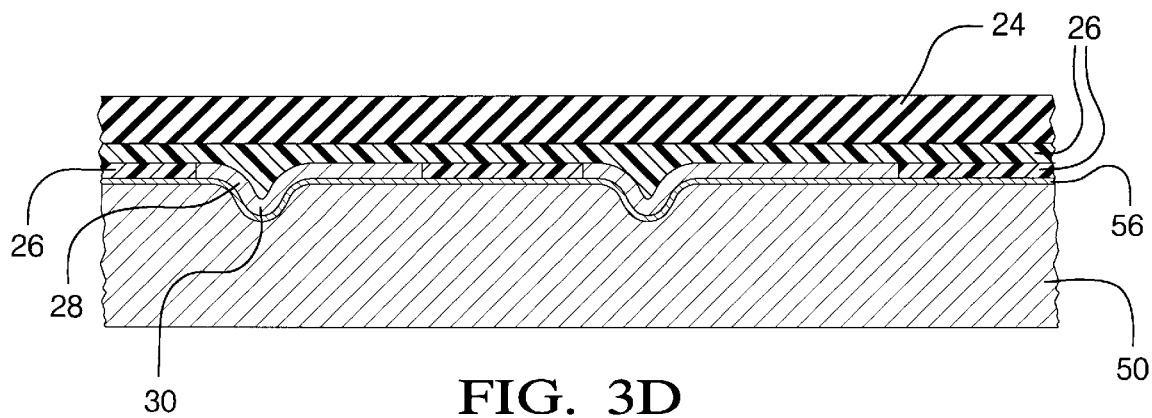

The photoresist 58 is then stripped to leave the circuit traces 28 and flex circuit raised features 30 on the flash-plated copper coating which is still on the mandrel. The flexible circuit raised features 30 are partly hollow, having a depression. If deemed necessary or desirable, the depression formed in the electroplated raised feature may be filled with a solid material by placing a droplet of epoxy in the depression and then allowing the epoxy to cure. The depression may also be filled with the adhesive which will be described later. Now a layer of suitable dielectric 26 and adhesive such as, for example, a layer of Kapton and an adhesive, such as Pyralux® are laminated to the mandrel assembly with the traces and circuit features thereon under suitable high temperature and pressure. Only that side of the traces and pads that are directly in contact with the flash-plated copper on the mandrel is not laminated by the adhesive/Kapton substrate. An adhesive or compressible layer 24 may be applied over the insulation layer 26 or electrical traces 28, as shown in FIG. 3D. Alternatively, the compressible layer 24 may be used in place of the polyimide insulative layer 26. The compressible layer 24 may be an elastomeric material such as Z-Flex™ flexible adhesive of available from Courtaules High Performance Films.

The interposer or compressible layer 24 (42 in FIG. 4) has to primary functions. First, material of the interposer layer fills the irregularities in the surface of the substrate or electronic device with irregular topography (such as a multi-layer module) when it is being bonded to the electrical circuit that is on the mandrel. It is important that the interposer or compressible layer fills the space between the device with an irregular surface topography and the traces on the mandrel so that, after everything is cured, the surface of the finished product is as flat as the surface of the mandrel. The second role of the interposer or compressible layer is that of elastomer that allows compliance of the contact pads that may have slightly different heights (perhaps even a few microns). This allows the finished device to perform the function of a probe. Regardless of what is being probed, even wafers, there is always some irregularities in the pad planarity, and the height of the dots or raised features 30, 30' on the electrical traces. Placing a compressible material behind the flexible circuit that includes the raised features or dots 30, 30' allows sufficient compliance. In order to function as a probe, dot contact requires the probe to be flexible, but the high number of I/O required by multiple layer interconnections increases stiffness. The compressible layer separates the two requirements making both components easier and cheaper to build.

Figure 3E:
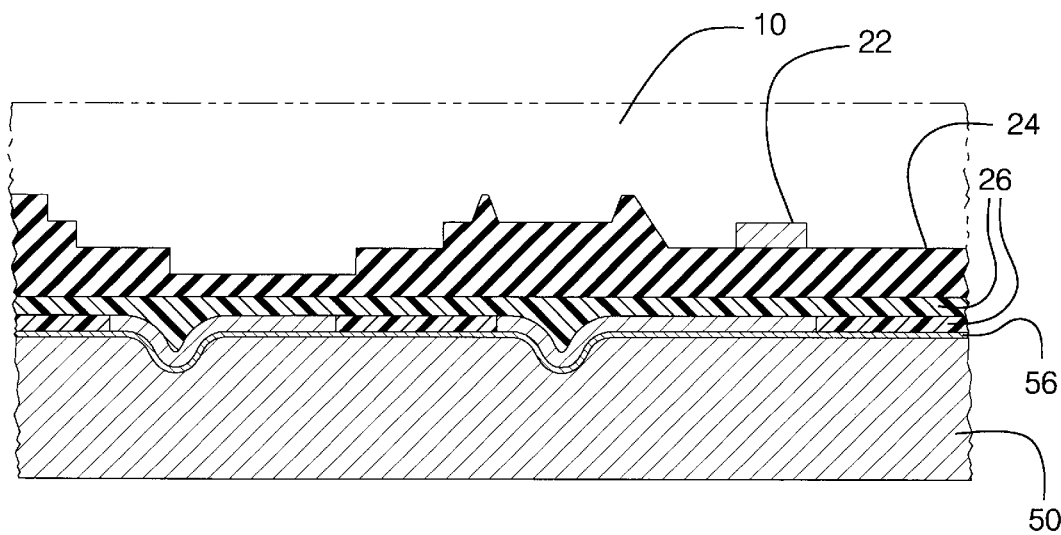
Figure 3F:
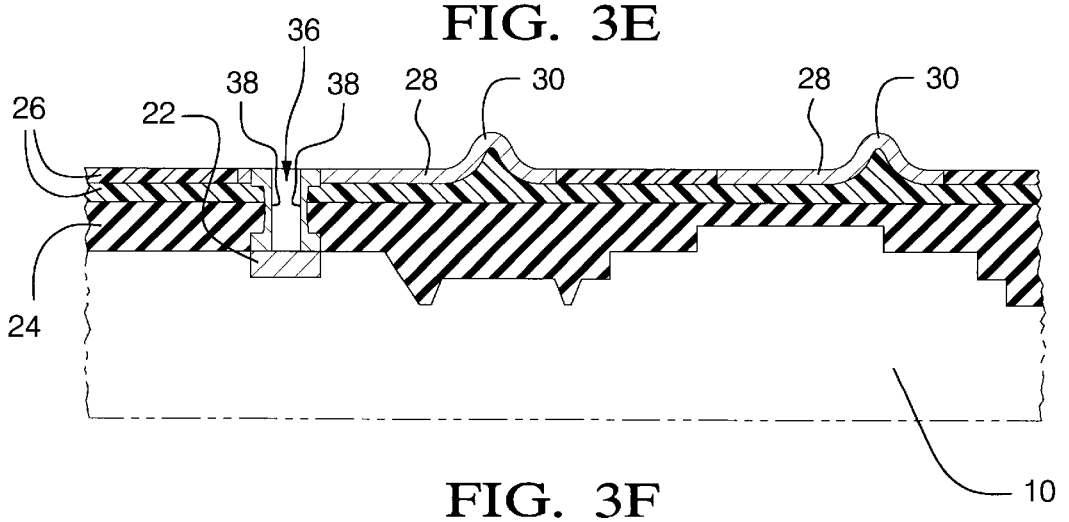

Referring to FIG. 3E, the nonplanar surface of the multi-layer substrate 10 is then placed against the adhesive or compressible layer 24 and secured thereto by adhesive, lamination or other suitable means. During this step, the compressible material or adhesive flows into and fills the irregular topography of the multi-layered substrate. Alternatively, a sheet of elastomeric material can be used as a spacer and bonded in place of the adhesive. Thereafter, the multi-layer substrate, adhesive and optional dielectric layer with circuit traces thereon are peeled off of the mandrel. Then the flash-plated copper 56 is etched away to produce a product having a substantially flat top surface with electrical traces 28 thereon and raised electrical contact features 30 for making contact to the semiconductor wafer.

Referring to FIG. 3E, as described earlier vias 36 may be provided through the dielectric layer and adhesive down to a contact pad 22 on the multi-layer substrate and an electrical conductive material 38 in the via.

Figure 4:
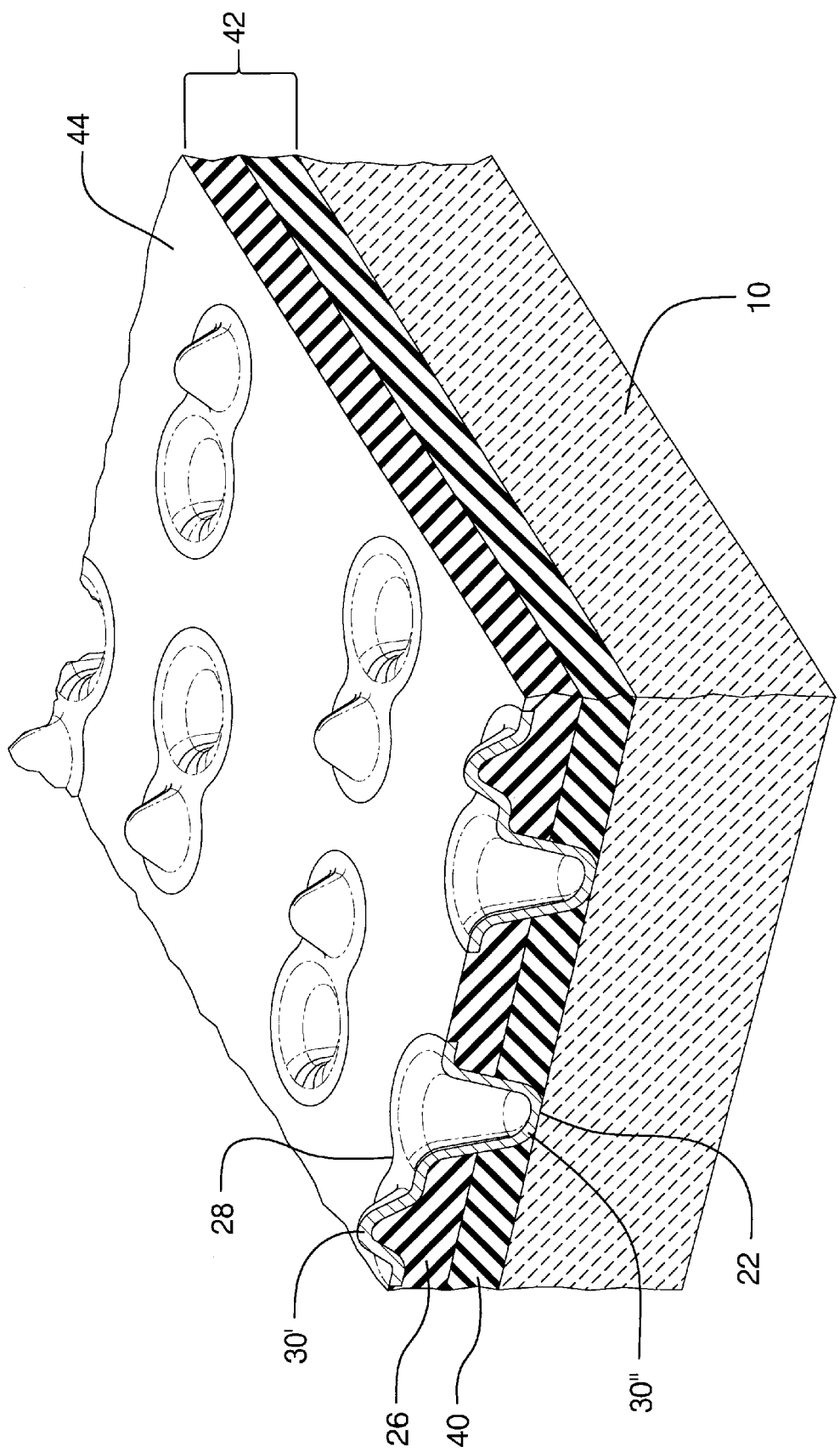
FIG. 4 illustrates an alternative embodiment utilizing an electrical trace having first and second raised features extending in opposite directions to make electrical contact between the wafer and multi-layer substrate.

In another embodiment shown in FIG. 4, the electrical trace 28 may have first and second raised features 30', 30" extending in the opposite directions and so that one of the raised features 30" extends through underlying layers 26 and 40 to make contact to a contact pad 22 on a multi-layer substrate 10. A method of making a flexible circuit having raised features protruding from two surfaces is described in assignee's copending patent application Attorney Docket number H-196377, entitled "Mandrel for Producing Circuits with Raised Features Protruding From Two Surfaces and Methods for Making and Using the Same," by Crumly, the disclosure of which is hereby incorporated by reference.

FIG. 4 illustrates a second embodiment of the present invention which includes, like FIG. 2, a multi-layer substrate 10 having a plurality of circuits overlying each and a nonplanar top surface. An interposer layer 42 is provided over the nonplanar top surface of the multilayer substrate. Electrical traces 28 having raised contact features 30', 30" are provided on the interposer layer. Again, the interposer layer 42 may be made from a variety of materials but preferably is a dielectric adhesive such as Z-Flex™ available from the Courtaules. The interposer layer 42 has a top surface 44 which is substantially planar and sufficient so that the raised contact features 30' extending away from the multi-layer substrate 10 (and toward the wafer) all have the same height and may be connected to associated contact pads on a flat semiconductor wafer having a plurality of circuits defined therein. As will be appreciated from FIG. 4, the interposer layer 42 includes a flexible circuit layer 26 such as a polyimide layer and an adhesive and/or compressible layer 40. Naturally, the flexible circuit layer 26 can be removed and an elastomeric adhesive, or an adhesive and compressible layer may be provided directly underneath the electrical traces 28 and raise contact features 30'.

From the above disclosure it would be appreciated that problems associated with burn-in testing of wafer scale semiconductor devices utilizing a multi-layer substrate can be overcome by utilizing a flexible circuit having a compressible layer thereunder to compensate for nonplanar surfaces on the multi-layer substrate. Alternatively the problems associated with nonplanar surface of a multi-layer substrate can be overcome by building a test product on a mandrel with an interposer layer designed to compensate for the irregularities in a topography of the multi-layer substrate.

What is claimed is:

1. A product for testing a semi conductor wafer comprising a multi-layer substrate having a plurality of electrical circuits defined therein and overlying each other, the multi-layer substrate having a top surface which is nonplanar and includes a plurality of bumps and valleys, the multi-layer substrate having a circuit contact pad exposed at the top surface of the multi-layer substrate;

a compressible interposer overlying the top surface of the multi-layer substrate, and an electrical trace having a planar surface flush with a top surface of the interposer, the electrical trace having a raised contact feature extending above the planar surface of the electrical trace, and an electrically conductive material extending downward from the electrical trace to the contact pad on the multi-layer substrate, the interposer having a first surface contacting the top surface of the multi-layer substrate and a second surface which in combination with the electrical trace is substantially planar with the exception of the raised contact feature which extends above the planar portion of the electrical trace, and the second surface, the planar portion of the electrical trace and the raised contact feature being exposed to facilitate the raised contact feature contacting the semiconductor wafer.

2. A product comprising a multi-layer substrate having a plurality of electrical circuits defined therein and overlying each other, the multi-layer substrate having a top surface which is nonplanar and includes a plurality of bumps and valleys, the multi-layer substrate having a circuit contact pad exposed at the top surface of the multi-layer substrate;

an interposer overlying the top surface of the multi-layer substrate, and an electrical trace overlying the interposer, the electrical trace having a raised contact feature extending above a planar surface of the electrical trace, and an electrically conductive material extending downward from the electrical trace to the contact pad on the multi-layer substrate, wherein the interposer comprises an adhesive layer and a compressible layer, and the electrical trace is unitary and comprises a first raised feature extending above the planar surface of the electrical trace, and a second raised feature extending below the planar surface of the electrical trace making contact with the contact pad on the multi-layer substrate.

3. A product comprising a multi-layer substrate having a plurality of electrical circuits defined therein and overlying each other, the multi-layer substrate having a top surface which is nonplanar and includes a plurality of bumps and valleys, the multi-layer substrate having a circuit contact pad exposed at the top surface of the multi-layer substrate;

an interposer overlying the top surface of the multi-layer substrate, and an electrical trace overlying the interposer, the electrical trace having a raised contact feature extending above a planar surface of the electrical trace, and an electrically conductive material extending downward from the electrical trace to the contact pad on the multi-layer substrate, the interposer comprising an adhesive layer and a compressible layer that is secured to the top surface of the multi-layer substrate and constructed and arranged so that upon engagement of the raised features with contact pads on a semiconductor device, the compressible layer compensates for any irregularities in the topography of the multi-layer substrate, and a flexible dielectric layer carrying a portion of the electrical trace.

4. The product as set forth in claim 3 further comprising a contact pad on the electrical trace, a via formed through the interposer and aligned with a contact pad on the multi-layer substrate and the contact pad of the electrical trace, and an electrically conductive material in the via to provide an electrical connection from the multi-layer substrate to the raised feature on the electrical trace.

5. A product as set forth in claim 4 wherein said contact pad on the electrical trace is spaced a distance from said raised feature so that said raised feature is free to move vertically upon engagement with contact pads on a semiconductor device.

6. A product as set forth in claim 3 wherein the compressible layer is capable of being compressed with an application of minimal force.

7. A product comprising a multi-layer substrate having a plurality of electrical circuits defined therein and overlying each other, the multi-layer substrate having a top surface which is nonplanar and includes a plurality of bumps and valleys, the multi-layer substrate having a circuit contact pad exposed at the top surface of the multi-layer substrate;

an interposer overlying the top surface of the multi-layer substrate, and an electrical trace overlying the interposer, the electrical trace having a raised contact feature extending above a planar surface of the electrical trace, and an electrically conductive material extending downward from the electrical trace to the contact pad on the multi-layer substrate, wherein the interposer comprises an adhesive layer and a compressible layer that is selected from the group consisting of elastomer, foam, and rubber.

* * * * *